(12) United States Patent
Jeong et al.

(10) Patent No.: US 7,710,143 B2
(45) Date of Patent: May 4, 2010

(54) IMPEDANCE MATCHING CIRCUIT AND SEMICONDUCTOR MEMORY DEVICE WITH THE SAME

(75) Inventors: Chun-Seok Jeong, Kyoungki-Do (KR); Jae-Jin Lee, Kyoungki-Do (KR)

(73) Assignee: Hynix Semiconductor, Inc., Gyeonggi-di (KR)

( * ) Notice: Subject to any disclaimer, the term of this patent is extended or adjusted under 35 U.S.C. 154(b) by 33 days.

(21) Appl. No.: 11/967,659

(22) Filed: Dec. 31, 2007

(65) Prior Publication Data
US 2008/0211534 A1 Sep. 4, 2008

(30) Foreign Application Priority Data
Mar. 2, 2007 (KR) ............... 10-2007-0020727

(51) Int. Cl.
*H03K 17/16* (2006.01)
*H03K 19/003* (2006.01)
(52) U.S. Cl. .................................. 326/30; 326/16
(58) Field of Classification Search .............. 326/26, 326/27, 30, 86, 87; 327/108–109; 365/189.05, 365/189.11, 202, 233.1; 333/17.3, 32
See application file for complete search history.

(56) References Cited

U.S. PATENT DOCUMENTS

| 2003/0218477 | A1* | 11/2003 | Jang et al. .................... 326/30 |
| 2007/0263459 | A1* | 11/2007 | Kim et al. ............... 365/189.11 |
| 2008/0100334 | A1* | 5/2008 | Kim et al. ................... 326/30 |

FOREIGN PATENT DOCUMENTS

| KR | 2004-0083814 | 10/2004 |
| KR | 2005-0104236 | 11/2005 |

* cited by examiner

*Primary Examiner*—James H. Cho
*Assistant Examiner*—Jany Tran
(74) *Attorney, Agent, or Firm*—IP & T Law Firm PLC

(57) ABSTRACT

An impedance matching circuit of a semiconductor memory device performs a ZQ calibration with initial values that reflect an offset error according to variations in a manufacturing process. The impedance matching circuit includes a first pull-down resistance unit, a first pull-up resistance unit, and a code generation unit. The first pull-down resistance unit supplies a ground voltage to a first node, thereby determining an initial pull-down code. The first pull-up resistance unit supplies a supply voltage to the first node, thereby determining an initial pull-up code or a voltage level on the first node. The code generation unit generates pull-down and pull-up calibration codes using the initial pull-down and pull-up codes as respective initial values.

23 Claims, 4 Drawing Sheets (PRIOR ART)

IMPEDANCE MATCHING CIRCUIT AND SEMICONDUCTOR MEMORY DEVICE WITH THE SAME

CROSS-REFERENCE TO RELATED APPLICATIONS

The present invention claims priority to Korean patent application no. 10-2007-0020727, filed on Mar. 2, 2007, which is incorporated by reference in its entirety.

BACKGROUND OF THE INVENTION

The present invention relates to an impedance matching circuit in a semiconductor memory device, and more particularly to a ZQ calibration performed by the impedance matching circuit.

Generally, semiconductor memory devices that include an integrated circuit such as a microprocessor, a memory circuit and a gate array circuit, are used in various electrical appliances, e.g., personal computers, server computers and workstations. As the operating speed of the electrical appliances increases, a swing width of signals transmitted between semiconductor memory devices inside the electrical appliances decreases to minimize a delay time taken to transmit the signals. However, as the swing width decreases, signal transmission is affected by external noise to a greater degree and signal reflection in an interface terminal increased due to impedance mismatching.

The impedance mismatch is caused by variation of the manufacturing process, the supply voltage and the operating temperature (PVT). This impedance mismatch makes it hard to transmit data at high speeds. Because a signal outputted from a semiconductor memory device may be distorted by the impedance mismatch, a malfunction such as a set up/hold failure or a misjudgment of a signal level may be caused in a corresponding semiconductor memory device receiving the distorted signal.

A semiconductor memory device may include an input circuit for receiving external signals through an input pad and an output circuit for outputting internal signals through an output pad. Particularly, a semiconductor memory device operating at a high speed may include an impedance matching circuit for matching interface impedance with another semiconductor memory device near the pads in order to prevent the above malfunctions.

Generally, in a semiconductor memory device transmitting a signal, source termination is performed by an output circuit. In a semiconductor memory device receiving a signal, parallel termination may be performed by a termination circuit parallelly connected to an input circuit.

The ZQ calibration is a process for generating pull-up and pull-down calibration codes that change as PVT conditions change. Resistance values of input and output circuits are calibrated by using the pull-up and pull-down calibration codes. The ZQ calibration performed in the impedance matching circuit is described below.

FIG. 1 is a block diagram of a conventional impedance matching circuit. The impedance matching circuit includes a first pull-up resistance unit 110, a second pull-up resistance unit 120, a pull-down resistance unit 130, a reference voltage generator 102, comparators 103 and 104, and p-code and n-code counters 105 and 106.

A supply voltage VDDQ is divided by the first pull-up resistance unit 110 and a reference resistor 101, thereby providing a voltage to a node ZQ. The reference resistor 101, which is connected to a pin coupled to the node ZQ, generally has a resistance of 240Ω. The comparator 103 compares the voltage at the node ZQ with a reference voltage VREF outputted from the reference voltage generator 102, thereby generating an up/down signal UP/DN. The reference voltage VREF is generally set to half of the supply voltage, i.e., VDDQ/2.

The p-code counter 105 receives the up/down signal UP/DN, thereby generating a binary code PCODE<0:N>. The binary code PCODE<0:N> turns on/off MOS transistors coupled in parallel in the first pull-up resistance unit 110, thereby calibrating resistance of the first pull-up resistance unit 110. The calibrated resistance of the first pull-up resistance unit 110 has an effect on the voltage at the node ZQ. The above operations are repeated. That is, the pull-up calibration is performed in the first pull-up resistance unit 110 so that the resistance of the first pull-up resistance unit 110 becomes identical to that of the reference resistor 101.

The binary code PCODE<0:N> generated during the pull-up calibration is also inputted to the second pull-up resistance unit 120 and determines its resistance. Similarly to the pull-up calibration, a pull-down calibration is performed. A voltage at a node ZQ' becomes identical to the reference voltage VREF by applying a binary code NCODE<0:N> generated by the comparator 104 and the n-code counter 106. The pull-down calibration is performed so that the resistance of the pull-down resistance unit 130 becomes identical to that of the second pull-up resistance unit 120.

The ZQ calibration includes the pull-tip calibration and the pull-down calibration. The binary codes PCODE<0:N> and NCODE<0:N> resulting from the ZQ calibration are inputted to an input or output circuit so as to calibrate the respective resistance of the input or output circuit. In the case of the semiconductor memory device, the binary codes PCODE<0:N> and NCODE<0:N> determine the resistance of pull-up and pull-down resistors connected to ZQ pads. Since the pull-up and pull-down resistors have an identical layout to the above pull-tip and pull-down resistance units. illustrating their structures in the drawings is omitted.

While an output driver of the semiconductor memory device uses both pull-up and pull-down resistors, an input buffer of the semiconductor memory device uses only a pull-up resistor. In that case, the impedance matching circuit includes the pull-up resistance unit 110, the p-code counter 105 and comparator 103. Only the pull-up calibration is then performed.

The ZQ calibration prevents an impedance mismatch from occurring. However, the bandwidth of data transmitted by the semiconductor memory device is reduced as the operating time for the ZQ calibration is lengthened. Accordingly, the time for the ZQ calibration must be minimized to improve transmission efficiency of the data as well as prevent an impedance mismatch.

SUMMARY OF THE INVENTION

Embodiments of the present invention are directed to providing an impedance matching circuit for performing a ZQ calibration with initial values that reflect an offset error according to variation in a manufacturing process.

In one embodiment, an impedance matching circuit of a semiconductor memory device includes a first pull-down resistance unit for supplying a ground voltage to a first node, thereby determining an initial pull-down code, a first pull-up resistance unit for supplying a supply voltage to the first node, thereby determining an initial pull-up code or a voltage level on the first node, and a code generation unit for generating pull-down and pull-up calibration codes using the initial pull-down and pull-up codes as initial values respectively.

In another embodiment, a method for performing a ZQ calibration of a semiconductor memory device includes measuring a first real resistance between a supply voltage terminal and a ZQ node, and a second real resistance between a ground voltage terminal and the ZQ node, determining initial pull-up and pull-down codes by comparing each of the first and second real resistances with its intended resistance in a manufacturing process, respectively, and storing the initial pull-up and pull-down codes in a storage unit as initial values of pull-up and pull-down calibration codes respectively.

In still another embodiment, an impedance matching circuit of a semiconductor memory device includes a calibration resistance unit connected to a first node for determining an initial calibration code or a voltage level on the first node, and a code generation unit for generating a calibration code having the initial calibration code as an initial value based on the voltage level on the first node.

DESCRIPTION OF SPECIFIC EMBODIMENTS

An impedance matching circuit in accordance with the present invention performs a ZQ calibration with initial values, which reflect an offset error according to variations in a manufacturing process. Therefore, the impedance matching circuit performs the ZQ calibration to compensate for an impedance mismatch caused only by variation of supply voltage and operating temperature. The impedance matching circuit in accordance with the present invention performs the ZQ calibration rapidly. As the impedance matching circuit is applied to a semiconductor memory device, it is possible to prevent a reduction of bandwidth of data transmitted by the semiconductor memory device is reduced. In addition, as the ZQ calibration is performed within a predetermined time, the semiconductor memory device can easily satisfy the specification with respect to operating time.

Hereinafter, an impedance matching circuit in accordance with the present invention will be described in detail referring to the accompanying drawings.

Figure 1:
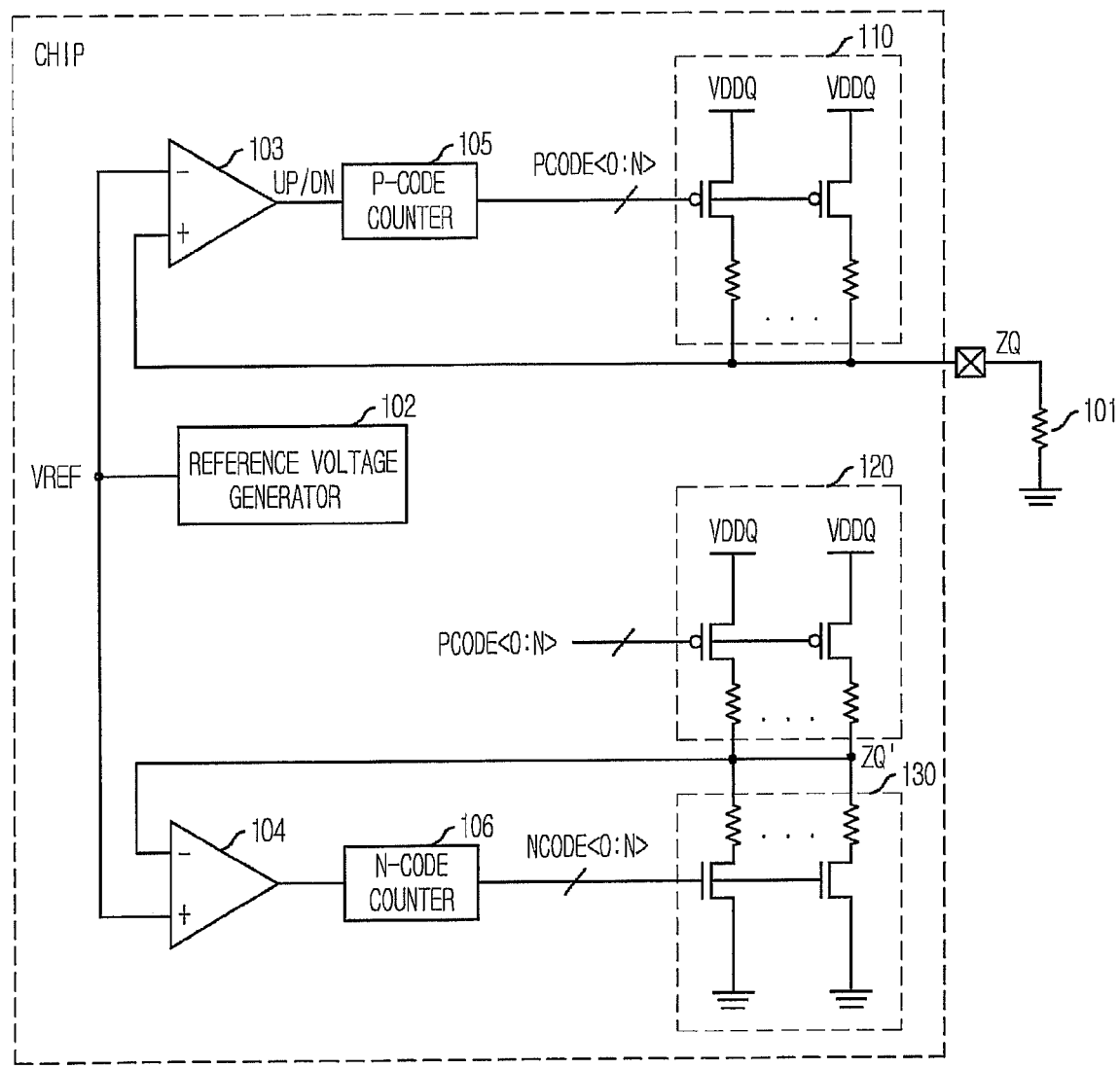
FIG. 1 is a block diagram of a conventional impedance matching circuit.
Figure 2:
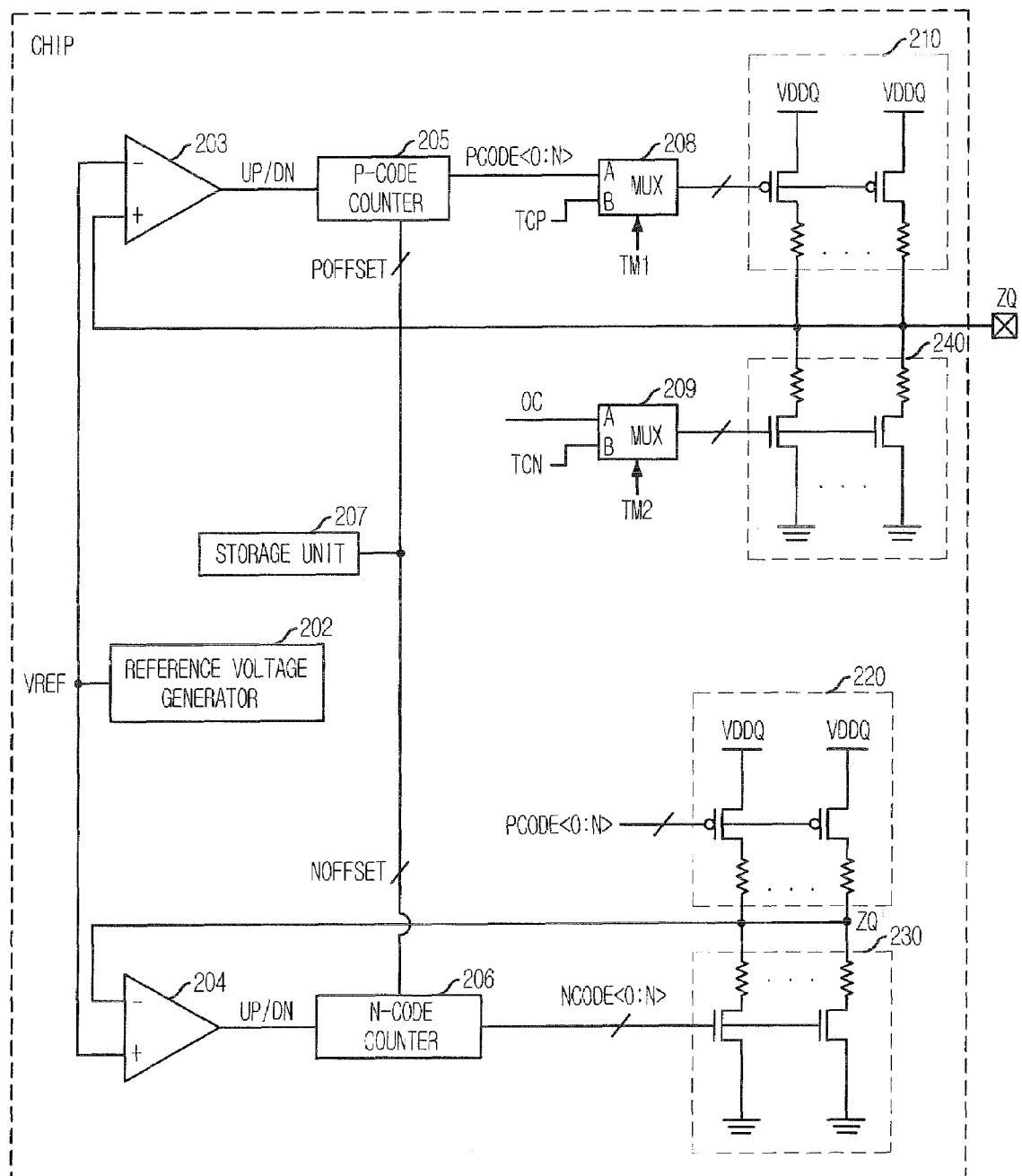
FIG. 2 is a block diagram of an impedance matching circuit in accordance with an embodiment of the present invention.

FIG. 2 illustrates an impedance matching circuit in accordance with an embodiment of the present invention. The impedance matching circuit includes a first pull-up resistance unit 210, a second pull-up resistance unit 220, a pull-down resistance unit 230, a dummy pull-down resistance unit 240 and code generation units 202 to 206.

As compared with a conventional impedance matching circuit, the impedance matching circuit of the present invention further includes the dummy pull-down resistance unit 240 for setting initial pull-up and pull-down codes POFFSET and NOFFSET. The dummy pull-down resistance unit 240 provides a ground voltage to the node ZQ. The code generation units 202 to 206 generate pull-up and pull-down codes PCODE<0:N> and NCODE<0:N> using the initial pull-up and pull-down codes POFFSET and NOFFSET, respectively, as initial values.

The dummy pull-down resistance unit 240 has the same structure as the pull-down resistance unit 230 to measure the real resistance of the pull-down resistance unit 230 to which reflects the offset error due to variations in the manufacturing process. Because the pull-down resistance unit 230 is not coupled to an external pin, the resistance of pull-down resistance unit 230 cannot be measured directly. Accordingly, the dummy pull-down resistance unit 240 is connected to the node ZQ to measure the resistance. The resistance can be measured using the value of the current flowing in the node ZQ at a predetermined voltage. A resistance of the first pull-up resistance unit 210 is measured in the same way. The measurement method will be described in detail as follows.

The offset error due to variation in the manufacturing process can be detected by measuring the resistance. For example, if the measured resistance of the dummy pull-down resistance unit 240 is a resistance of 230Ω when the resistance of the dummy pull-down resistance unit 240 was 240Ω originally, the offset error is a resistance of 10Ω. The initial pull-down code NOFFSET is then set to the offset error.

Because the initial pull-down code NOFFSET is used as the initial value of the pull-down code NCODE<0:N>, the impedance mismatch caused by variations in the manufacturing process can be compensated without the pull-down calibration. Accordingly, calibration for compensating the impedance mismatch caused by the variation in supply voltage and operating temperature is only performed during the pull-down calibration. The pull-down calibration is therefore performed more rapidly.

The dummy pull-down resistance unit 240 turns off after the initial pull-down code NOFFSET is determined. As illustrated in FIG. 2, the impedance matching circuit further includes a multiplexer 209 to turn off the dummy pull-down resistance 240. The multiplexer 209 inputs a pull-down test code TCN or an off code OC to the dummy pull-down resistance unit 240 in response to a test mode signal TM2. While the initial pull-down code NOFFSET is set, the dummy pull-down resistance unit 240 is activated in response to the pull-down test code TCN. The dummy pull-down resistance unit 240 is deactivated in response to the off code OC. The test mode signal TM2 may be set to be enabled to select the pull-down test code TCN, or the off code OC. Because the dummy pull-down resistance unit 240 turns off once the initial pull-down code NOFFSET is determined, a fuse may be used for the selection.

The dummy pull-down resistance unit 240 includes MOS transistors in parallel, and resistors serially connected to each MOS transistor, as does the pull-down resistance unit 230. The MOS transistors each receive the codes through their respective gates.

The initial pull-up code POFFSET is determined by measuring the real resistance of the first pull-up resistance 210. The first pull-up resistance unit 210 calibrates its resistance to an external resistance in response to the pull-up code PCODE<0:N>. However, while the initial pull-up code POFFSET is determined, the first pull-up resistance unit 210 receives a pull-up test code TCP instead of the pull-up code PCODE<0:N>. The pull-up test code TCP turns on the first pull-up resistance unit 210 in order to measure its resistance.

The multiplexer 208 is provided to input the pull-up test code TCP or the pull-up code PCODE<0:N> to the first pull-up resistance unit 210 in response to a test mode signal TM1. The test mode signal TM1 may be set to be enabled to select the pull-up test code TCP, or the pull-up code PCODE<0:N>. Accordingly, it can be arranged that the first pull-up resistance unit 210 receives the pull-up test code TCP while the initial pull-up code POFFSET is set. In this case, a fuse can also be used.

The resistance of the first pull-up resistance unit 210 is measured as a way of measuring that of the dummy pull-down resistance unit 240, but while the dummy pull-down resistance unit 240 is turned off. Based on the resistance, an offset error is calculated, thereby setting the initial pull-up code POFFSET.

The initial pull-up code POFFSET is used as the initial value of the pull-up code PCODE<0:N>. The second pull-up resistance unit 220 has the same resistance as the first pull-up resistance unit 210 by receiving the pull-up code PCODE<0:N>. The first and second pull-up resistance units 210 and 220 include PMOS transistors and resistors serially connected to the PMOS transistors. The PMOS transistors each receive corresponding codes through their respective gates.

The code generation unit includes a reference voltage generator 202, comparators 203 and 204, and p-code and n-code counters 205 and 206. The reference voltage generator 202 generates a reference voltage VREF. A first comparator 203 compares a voltage at the node ZQ with the reference voltage VREF, thereby generating an up/down signal UP/DN. The p-code counter 205 receives the up/down signal UP/DN, thereby generating the pull-up code PCODE<0:N>. A second comparator 204 compares a voltage at a node ZQ' with the reference voltage VREF, thereby generating an up/down signal UP/DN'. The n-code counter 206 receives the up/down signal UP/DN', thereby generating the pull-down code NCODE<0:N>.

The p-code and n-code counters 205 and 206 receive the initial pull-up and pull-down codes POFFSET and NOFFSET, respectively, thereby using them as initial values of the pull-up and pull-down codes PCODE<0:N> and NCODE<0:N>, respectively. In case that the p-code and n-code counters 205 and 206 can store initial values, the initial pull-up and pull-down codes POFFSET and NOFFSET are input to the p-code and n-code counters 205 and 206. Otherwise, a storage unit is additionally included.

Referring to FIG. 2, the impedance matching circuit further includes the storage unit 207 for storing the initial pull-down and pull-up codes NOFFSET and POFFSET. After being set, the initial pull-down and pull-up codes NOFFSET and POFFSET are inputted to the storage unit 207. The storing unit 207 transmits the initial pull-down and pull-up codes NOFFSET and POFFSET to the counters 205 and 206 at ZQ calibration.

Referring to an operation of the impedance matching circuit illustrated in FIG. 2, the first pull-up resistance unit 210 turns on in response to the test mode signal TM1. At this time the dummy pull-down resistance unit 240 turns off. The resistance of the first pull-up resistance unit 210 is measured by supplying a predetermined voltage to the node ZQ.

Next, the dummy pull-down resistance unit 240 turns on in response to the test mode signal TM2. By measuring current flowing on the node ZQ at a predetermined voltage, the resistance of the dummy pull-down resistance unit 240 is calculated, as well as the resistance of the first pull-up resistance unit 210.

The initial pull-up and pull-down codes POFFSET and NOFFSET are determined based on the resistances and used as initial values of the pull-up and pull-down codes PCODE<0:N> and NCODE<0:N>. Until the pull-up and pull-down codes PCODE<0:N> and NCODE<0:N> begin to be generated, the initial pull-up and pull-down codes POFFSET and NOFFSET can be stored in many ways such as in counters generating the pull-up and pull-down codes PCODE<0:N> and NCODE<0:N>, or in an additionally provided storage unit.

As the impedance matching circuit performs the ZQ calibration, the pull-up calibration and the pull-down calibration are performed. During the pull-up calibration, the pull-up code PCODE<0:N> is generated in order for the first pull-up resistance unit 210 to have a resistance identical to that of an external resistor, by comparing the reference voltage VREF with the voltage at the node ZQ. During the pull-down calibration, the pull-down code NCODE<0:N> is generated in order for the pull-down resistance unit 210 to have a resistance identical to that of the second pull-up resistance unit 220, i.e., the first pull-up resistance unit 210, by comparing the reference voltage VREF with the voltage at the node ZQ'. Because the pull-up and pull-down calibrations are performed with the initial pull-up and pull-down codes POFFSET and NOFFSET that reflect the offset error, the pull-up and pull-down calibrations are performed faster in the present invention.

Figure 3:
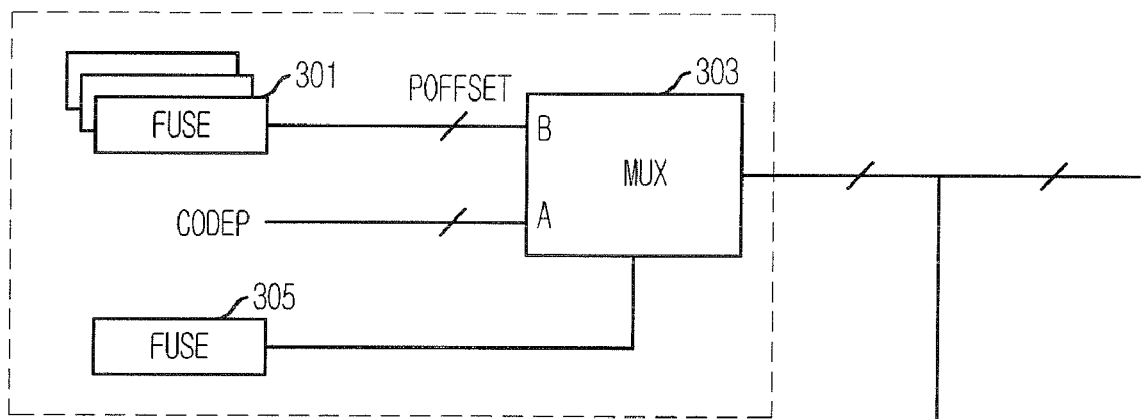
FIG. 3 is a block diagram of a storage unit as illustrated in FIG. 2.
Figure 3:
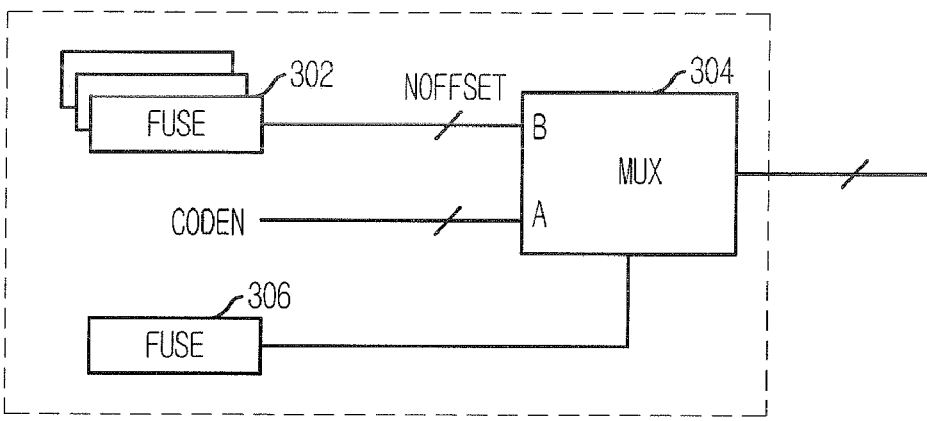

FIG. 3 is a block diagram of the storage unit 207 illustrated in FIG. 2. The storage unit 207 includes a plurality of fuse circuits 301 for storing the initial pull-up code POFFSET and a plurality of fuse circuits 302 for storing the initial pull-down code NOFFSET.

The initial pull-up and pull-down codes POFFSET and NOFFSET can be determined after a wafer stage of the manufacturing process because the offset error according to the variation of the manufacture process is caused during the wafer stage. Accordingly, after the wafer stage, the code can be stored by cutting corresponding fuses in the fuse circuits.

The storage unit 207 further includes multiplexers 303 and 304 for selectively outputting default values CODEN and CODEP. Unless the initial pull-up and pull-down codes POFFSET and NOFFSET are determined, the multiplexers 303 and 304 transmit default values CODEP and CODEN to the p-code and n-code counters 205 and 206 by controlling fuse circuits 305 and 306, respectively. The default values CODEP and CODEN are initial codes used in a conventional impedance matching circuit, which do not reflect the offset error. In that case, the impedance matching circuit of the present invention operates just as a conventional impedance matching circuit does.

After the initial pull-up and pull-down codes POFFSET and NOFFSET are determined, the fuses in the fuse circuits 301 and 302 are cut to store the initial pull-up and pull-down codes POFFSET and NOFFSET. The multiplexers 303 and 304 transmit the initial pull-up and pull-down codes POFFSET and NOFFSET to the p-code and n-code counters 205 and 206, respectively, by controlling the fuse circuits 305 and 306.

Each of the fuse circuits 301, 302, 305 and 306 includes a fuse and outputs a logic high or a logic low according to the fuse's cutting state. These fuse circuits are generally used in semiconductor memory devices and can be easily realized by those skilled in the art. Accordingly, a detailed description will be omitted.

Figure 4:
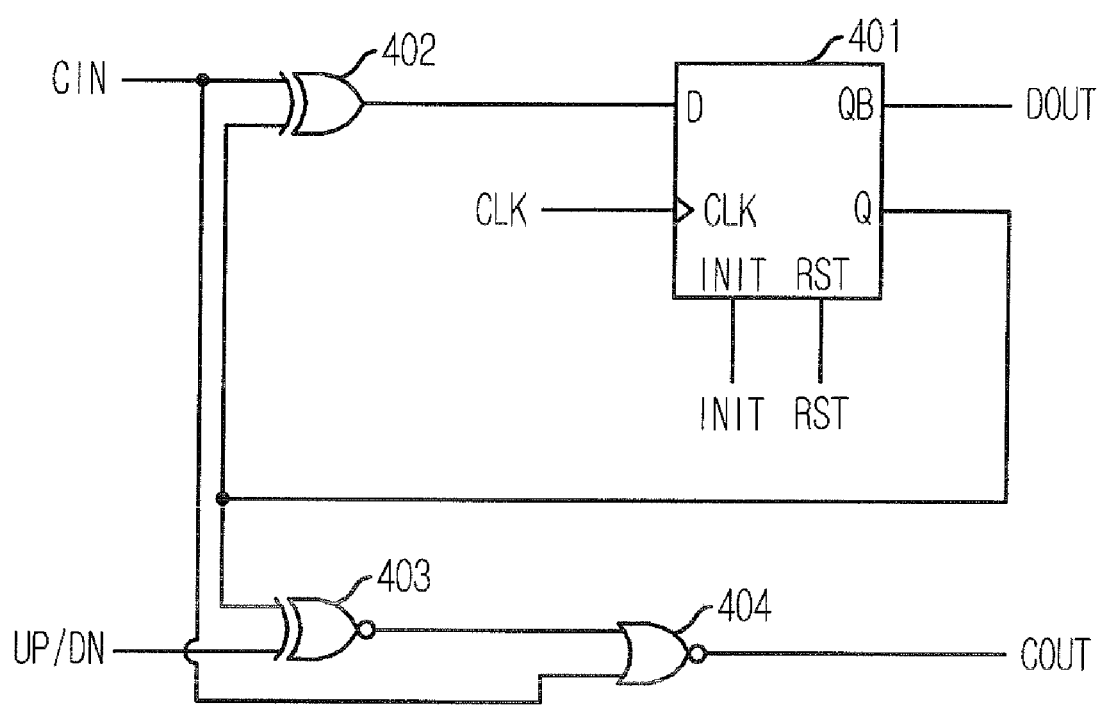
FIG. 4 is a block diagram of a bit count unit as included in each of the p-code and n-code counters shown in FIG. 2.

FIG. 4 is a block diagram of a bit count unit provided in the p-code and n-code counters 205 and 206 shown in FIG. 2. The p-code and n-code counters 205 and 206 include bit count units connected in series. For example, when the pull-up and pull-down codes PCODE<0:N> and NCODE<0:N> consist of a 6-bit code, six bit count units are provided to the counters 205 and 206 in series.

The bit count unit includes D flip-flop 401 and three logic gates 402 to 404. According to the up/down signals UP/DN and UP/DN' which are outputted from the comparators 203 and 204 respectively and input through a UP/DN terminal, the bit count unit operates as an adder or a subtractor. The signal CIN is a carry transmitted from the previous bit count unit. The signal COUT is a carry transmitted to the next bit count unit. Because a first bit count unit can not have the previous one, the first bit count unit receives a high or a low logic level of signal as the signal CIN by a predetermined setting.

The signal DOUT is an output of the counters 205 and 206, i.e., the pull-up code PCODE<0:N> or the pull-down code NCODE<0:N>. For example, in case that the p-code counter 205 includes six bit count units, the first bit count unit outputs a pull-up code PCODE<0> through its terminal Dout and the next one outputs a pull-up code PCODE<1> through its terminal Dout. And the last bit count unit outputs a pull-up code PCODE<5> through its terminal Dout.

The terminal INIT of the D flip-flop 401 is where an initial value is inputted. While an initial value which does not reflect the process offset error is inputted in the conventional bit count unit, the bit count unit of the present invention receives the initial pull-up or pull down code POFFSET or NOFFSET through the terminal INIT. For example, in case that the initial pull-up code POFFSET has a value of (0,1,1,0,1,0), first, fourth and sixth bit count units among the bit count units of p-code counter 205 receive a logic low level of '0' through each terminal INIT and second, third and fifth bit count units receive a logic high level of '1' through each terminal INIT.

That is, the initial pull-up and pull-down codes POFFSET and NOFFSET are used as initial values in the bit count unit. While the bit count unit is described with respect to particular embodiments, it can be embodied in various ways, which may differ even as to in which one of the p-code counter 205 and the n-code counter 206 the bit count unit is used.

The initial pull-up and pull-down codes POFFSET and NOFFSET may be used as initial values of predetermined bits of the pull-up and pull-down codes PCODE<0:N> and NCODE<0:N>. That is, even though the pull-up and pull-down codes PCODE<0:N> and NCODE<0:N> are 6-bit codes, the initial pull-up and pull-down codes POFFSET and NOFFSET may be precedent and partial bits of the 6-bit codes.

In that case, ZQ calibration can be performed rapidly. For example, when the initial pull-up and pull-down codes POFFSET and NOFFSET consist of 3-bit codes, three bit count units are configured to receive the initial pull-up or pull-down code POFFSET or NOFFSET. The others may be configured to receive the default value.

The impedance matching circuit in accordance with the embodiments of the present invention described herein includes the pull-up and pull-down resistance units and generates the pull-up and pull-down codes. The pull-up and pull-down codes determine pull-up and pull-down resistance of an interface circuit such as an output driver. However, the impedance matching circuit of the present invention can be applied to an interface circuit, which includes only one of the pull-up and pull-down resistors, such as an input buffer including only the pull-up resistor.

Referring to FIG. 2, in case that the interface circuit includes only a pull-up resistor, the pull-up resistance unit 210, the multiplexer 208 and the code generation unit 202, 203 and 205 (except 204 and 206) may be configured, to generate only pull-up codes. The other circuits for the pull-down calibration may be excluded. Similarly, the storage unit 207 is included or not according to such embodiments. Even though the impedance matching circuit performs only one of the pull-up and pull-down calibrations, the operation is substantially similar to that wherein both of the pull-up and pull-down calibrations are performed.

Referring to FIG. 2, a method for the impedance matching circuit to perform the ZQ calibration rapidly in accordance with the present invention is described below.

In the case where the storage unit is not used, the method includes generating the initial pull-up and pull-down codes POFFSET and NOFFSET using the first pull-up resistance unit 210 and dummy pull-down resistance unit 240 connected to a first node ZQ. The initial pull-up and pull-down codes POFFSET and NOFFSET are input as initial values of the pull-up and pull-down codes PCODE<0:N> and NCODE<0:N>.

In the case where the storage unit is used, the method includes generating the initial pull-up and pull-down codes POFFSET and NOFFSET using the first pull-up resistance unit 210 and dummy pull-down resistance unit 240 connected to a first node ZQ, and storing the initial pull-up and pull-down codes POFFSET and NOFFSET as initial values of the pull-up and pull-down codes PCODE<0:N> and NCODE<0:N> in the storage unit. In addition, in the case where the storage unit includes fuses, storing the initial pull-up and pull-down codes POFFSET and NOFFSET includes cutting the fuses according to the initial pull-up and pull-down codes POFFSET and NOFFSET.

The methods in both cases further include turning off the dummy pull-down resistance unit 240 after the initial pull-down codes NOFFSET is generated. In addition, both methods may be performed at the wafer process level with respect to manufacturing the semiconductor memory device including the impedance matching circuit.

While the present invention has been described with respect to the particular embodiments, it will be apparent to those skilled in the art that various changes and modifications may be made without departing from the spirit and scope of the invention as defined in the following claims.

What is claimed is:

1. An impedance matching circuit of a semiconductor memory device, comprising:
    a first pull-down resistance unit, activated with a test code in response to a test mode signal, for supplying a ground voltage to a first node to thereby determine an initial pull-down code;
    a first pull-up resistance unit for supplying a supply voltage to the first node to thereby determine an initial pull-up code or a voltage level on the first node;
    a code generation unit for generating pull-down and pull-up calibration codes using the initial pull-down and pull-up codes as initial values respectively; and
    a storage unit for storing the initial pull-down and pull-up codes, and selectively outputting one of the initial pull-down and pull-up codes and default values to the code generation unit.

2. The impedance matching circuit of claim 1, wherein the storage unit includes a plurality of fuses, connection of which is determined by the initial pull-down and pull-up codes.

3. The impedance matching circuit of claim 1, wherein the first node is a ZQ node.

4. The impedance matching circuit of claim 1, wherein the initial pull-down code is determined by comparing a real measured resistance of the first pull-down resistance unit with an intended resistance of the first pull-down resistance unit, and the initial pull-up code is determined by comparing a real measured resistance of the first pull-up resistance unit with an intended resistance of the first pull-up resistance unit.

5. The impedance matching circuit of claim 4, wherein the first pull-down resistance unit includes:
    a multiplexer for selecting one of the pull-down test code and an off code in response to the test mode signal;

NMOS transistors, each provided with a gate, for receiving a corresponding output of the multiplexer through the respective gate; and resistors, each of which is connected in series with a corresponding one of the NMOS transistors.

6. The impedance matching circuit of claim 5, wherein the first pull-down resistance unit is deactivated by the off code.

7. The impedance matching circuit of claim 4, wherein the first pull-up resistance unit includes:

a multiplexer for selecting one of a pull-up test code and the pull-up calibration code;

PMOS transistors, each provided with a gate, for receiving a corresponding output of the multiplexer through the respective gate; and resistors, each of which is connected in series with a corresponding one of the PMOS transistors.

8. The impedance matching circuit of claim 7, wherein the first pull-up resistance unit is activated in response to the pull-up test code, thereby determining the initial pull-up code, and calibrates its resistance to a resistance of a reference resistor in response to the pull-up calibration code, thereby determining the voltage level on the first node, wherein the reference resistor is connected between a supply voltage terminal and the first node.

9. The impedance matching circuit of claim 1, wherein the code generation unit includes:

a reference voltage generator for generating the a reference voltage;

a comparator for comparing the voltage level on the first node with the reference voltage, thereby generating an up/down signal; and a counter for generating the pull-up calibration code according to a logic level of the up/down signal.

10. The impedance matching circuit of claim 1, further comprising:

a second pull-up resistance unit for calibrating its resistance to a resistance of the first pull-up resistance unit in response to the pull-up calibration code; and a second pull-down resistance unit for calibrating its resistance to a resistance of the second pull-up resistance unit in response to the pull-down calibration code, wherein the second pull-up and pull-down resistance units are connected through a second node between supply and ground voltage terminals.

11. The impedance matching circuit of claim 10, wherein the second pull-up resistance unit includes:

PMOS transistors, each provided with a gate, for receiving a corresponding code of the pull-up calibration code through the respective gate; and resistors, each of which is connected in series with a corresponding one of the PMOS transistors.

12. The impedance matching circuit of claim 10, wherein the second pull-down resistance unit includes:

NMOS transistors, each provided with a gate, for receiving a corresponding code of the pull-down calibration code through the respective gate; and resistors, each of which is connected in series with a corresponding one of the NMOS transistors.

13. The impedance matching circuit of claim 10, wherein the code generation unit includes:

a reference voltage generator for generating a reference voltage;

a first comparator for comparing the voltage level on the first node with the reference voltage, thereby generating a first up/down signal;

a second comparator for comparing a voltage level on the second node with the reference voltage, thereby generating a second up/down signal;

a pull-up counter for generating the pull-up calibration code according to a logic level of the first up/down signal; and a pull-down counter for generating the pull-down calibration code according to a logic level of the second up/down signal.

14. A method for performing a ZQ calibration of a semiconductor memory device, comprising:

measuring a first real resistance between a supply voltage terminal and a ZQ node, and a second real resistance between a ground voltage terminal and the ZQ node by selectively activating resistance units connected between the supply and ground voltage terminals with test codes in response to a test mode code;

determining initial pull-up and pull-down codes by comparing each of the first and second real resistances with its intended resistance, respectively; and storing the initial pull-up and pull-down codes in a storage unit as initial values of pull-up and pull-down calibration codes respectively.

15. The method of claim 14, wherein storing the initial pull-up and pull-down codes includes culling fuses of the storage unit according to a corresponding code of the initial pull-up and pull-down codes.

16. The method of claim 14, wherein the ZQ calibration is performed in a wafer process of manufacturing the semiconductor memory device.

17. An impedance matching circuit of a semiconductor memory device, comprising:

a calibration resistance unit connected to a first node for determining an initial calibration code or a voltage level on the first node;

a code generation unit for generating a calibration code having the initial calibration code as an initial value based on the voltage level on the first node; and a storage unit for storing the initial calibration code, thereby selectively outputting one of the initial calibration code and a default value to the code generation unit, wherein the calibration resistance unit includes a dummy resistance unit activated with a test code in response to a test mode signal to generate the initial calibration code.

18. The impedance matching circuit of claim 17, wherein the storage unit includes a plurality of fuses which are programmed according to the initial calibration code.

19. The impedance matching circuit of claim 17, wherein the first node is a ZQ node.

20. The impedance matching circuit of claim 17, wherein the calibration resistance unit supplies a supply voltage to the first node and the calibration code is used to determine a resistance of pull-up resistors connected to a ZQ pad.

21. The impedance matching circuit of claim 17, wherein the calibration resistance unit supplies a ground voltage to the first node and the calibration code is used to determine a resistance of pull-down resistors connected to a ZQ pad.

22. The impedance matching circuit of claim 17, wherein the initial calibration code is determined by comparing a real measured resistance of the calibration resistance unit with an intended resistance of the calibration resistance unit.

23. The impedance matching circuit of claim 22, wherein the calibration resistance unit generates the initial calibration code by using the test code and calibrates its resistance to an external resistance in response to the calibration code, thereby determining the voltage level on the first node.

* * * * *